United States Patent [19]

Yamasawa et al.

[11] 4,429,300
[45] Jan. 31, 1984

[54] HIGH SPEED SHIFT REGISTER CIRCUIT

[75] Inventors: Masao Yamasawa, Kawasaki; Tetsuo Soejima, Musashino, both of Japan

[73] Assignee: Fujitsu Limited, Kawasaki, Japan

[21] Appl. No.: 368,829

[22] Filed: Apr. 15, 1982

Related U.S. Application Data

[63] Continuation of Ser. No. 52,259, Jun. 26, 1979.

[30] Foreign Application Priority Data

Jun. 26, 1978 [JP] Japan .................................. 55-76380

[51] Int. Cl.³ .......................................... H03K 13/256
[52] U.S. Cl. ............................... 340/347 DD; 377/64; 377/73
[58] Field of Search .................. 340/347 DD; 377/64, 377/73, 76, 54

[56] References Cited

U.S. PATENT DOCUMENTS 3,160,876 12/1964 Stochel ...................... 340/347 DD
3,310,626 3/1967 Cassidy ...................... 340/347 DD
4,152,698 5/1979 van Deursen ............... 340/347 DA

OTHER PUBLICATIONS

Snyder, Serial-Parallel Data Converter, IBM Technical Disclosure Bulletin, vol. 8, No. 2, 7/1965, pp. 226–228.
Williams, Deserializer, IBM Technical Disclosure Bulletin, vol. 14, No. 2, 7/1971, p. 653

Primary Examiner—T. J. Sloyan
Attorney, Agent, or Firm—Staas & Halsey

[57] ABSTRACT

A shift register circuit for converting a form of a datum with N bits comprises a shift register with a bit capacity of at least N+1 bits. Each bit of the shift register is set so as to become a predetermined logic condition by a setting means. At this time, the supply of shift pulses to the shift register is begun, so that the data in the shift register is shifted and predetermined data are input in sequence. A detecting means detects whether or not the shift register has carried out the shift operations by the predetermined times on the basis of the logical condition of the predetermined bit or bits in the shift register. When the detecting means detects that the shift operations have been carried out by the predetermined times, the supply of the shift pulses to the shift register is stopped. This shift register circuit can be used for a parallel to serial converter or a serial to parallel converter.

7 Claims, 21 Drawing Figures

HIGH SPEED SHIFT REGISTER CIRCUIT

This is a continuation of application Ser. No. 052,259 filed June 26, 1979.

This invention relates to a shift register circuit, and more particularly to a shift register circuit used for a serial to parallel converter for digital data or a parallel to serial converter for digital data.

In various types of digital devices shift registers have been widely used for writing any required bits of the input serial data stream or for reading out input parallel data with N bits each as serial data with N bits each corresponding thereto. In a serial to parallel converter having a shift register, for example, the serial to parallel converter is arranged so as to produce a write command signal coinciding with the period of time corresponding to the required N bits (N represents a positive integer) of a serial data stream and control the supply of clock pulses for storing according to said write command signal, and further, storing the desired N bits of information in the shift register. Therefore, when this write command signal cannot be generated so that it coincides with the period for the required data with N bits, there is a tendency to cause such an erroneous operation that other extraneous information other than the required N bits is input or all of the data with N bits each cannot be completely read in its register.

When the high speed operation is required, the improvement of the accuracy of timing for its write command signal is also required and such a requirement has made it difficult to design the circuits for these registers. Also, in a pulse code modulation multiplex transmission system for pulse code modulation signals, for the purpose of reading out the pulse code modulated parallel data with a plurality of bits each in the form of serial data, a parallel to serial converter having a shift register is used. In such a converter, an high-accuracy timing signal which determines the start time for reading out the parallel data in series is required, so that the circuit construction becomes complicated.

In the both of the above mentioned cases, in order to eliminate the difficulties described above, a circuit is commonly employed, in which, for example, after exactly determining only the starting time for inputing (reading), the shift clock pulse number is counted using a counter and the feeding of said clock pulse is stopped through the counter output at the termination of the counting of N shift pulses, so that the desired N data may be accurately stored in a register. However, a circuit having such a counter suffers from the disadvantage that the circuit configuration may be complicated and large in size.

It is an object of the present invention to provide a shift register circuit wherein the above mentioned defects in the prior art are eliminated.

It is an another object of the present invention to provide a shift register circuit which is able to convert any bits of serial data to parallel data corresponding thereto only by determining the start time of the converting operation.

It is a further object of the invention to provide a shift register circuit which is not complicated and can be operated with high reliability.

It is a still another object of the present invention to provide a shift register circuit which is able to convert parallel data with a plurality of bits each to serial data corresponding thereto only by determining the start time of the converting operation.

A shift register circuit of the present invention comprises a shift register having a bit capacity of more than N bits of desired data by at least one and means for generating a start signal on the basis of a start command signal representing the start time of the operation of the shift register, and each bit of the shift register is set so as to become a predetermined logic condition by a setting means when the start signal is generated. At the time the shift register is set, the supply of shift pulses to the shift register is begun, so that the data in the shift register is shifted and predetermined data is input in sequence.

The shift register circuit of the present invention further comprises a detecting circuit for detecting whether or not the shift register has carried out the shift operations by the predetermined times on the basis of the logical condition of the predetermined bit or bits in the shift register. When the detecting circuit detects that the shift operations have been carried out by the predetermined times, the supply of the shift pulses to the shift register is stopped. As a result, the shift operations of the shift register are carried out the predetermined number of times.

In a preferred embodiment of the present invention, the shift register circuit is arranged so as to operate as a serial to parallel converter adapted to read a predetermined number of continuous bits of a serial data stream. With this serial to parallel converter, the desired data can be stored therein only by feeding to the shift register circuit the time of each first bit of the desired data and the stored data are read out as parallel data.

In another embodiment of the present invention, the shift register circuit is arranged so as to operate as a parallel to serial converter, wherein the desired number of shift pulses is supplied to the shift register only by feeding to the shift register circuit the start time for reading out, and then, the reading out operation can be perfectly performed.

Embodiments of the invention will now be described by way of examples, with reference to the accompanying drawings, in which.

Figure 1:
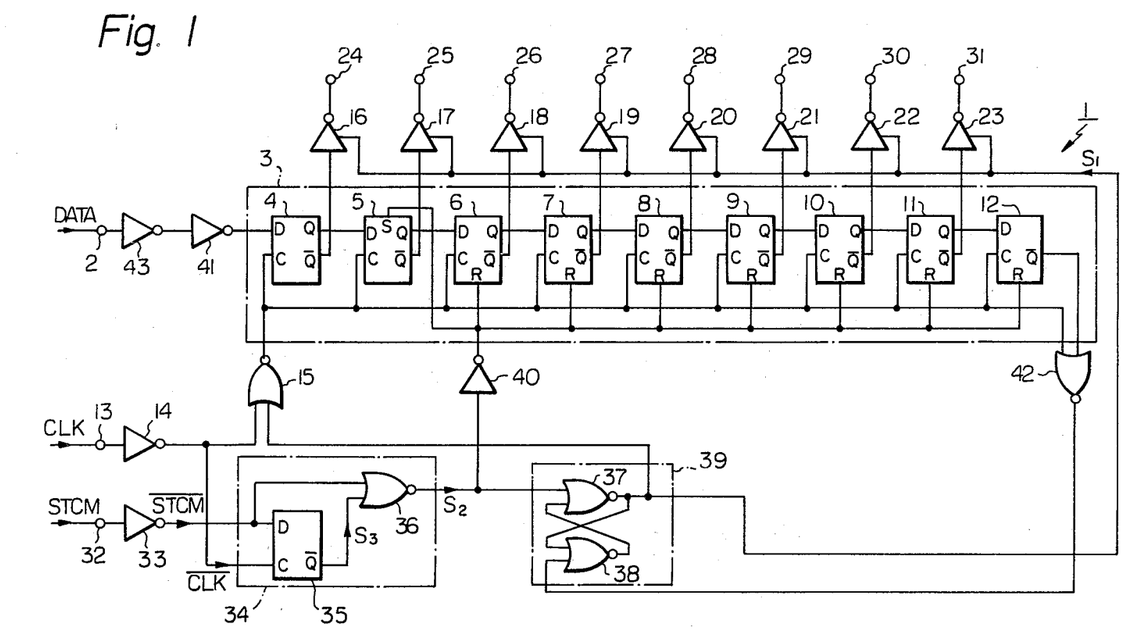
FIG. 1 is a circuit diagram of an embodiment according to the present invention.

FIG. 1 illustrates a buffer register circuit which is an embodiment according to the present invention. Referring to FIG. 1, a buffer register circuit 1 may be used for reading only the desired continuous 8 bit data of a serial data stream DATA fed, from a data input terminal 2, and is provided with a shift register 3 having the capacity of 8 bits plus 1 bit. The shift register 3 is a known circuit constituted by nine D type flip-flops 4 to 12 which are connected in series. A read clock signal CLK, transmitted from a clock pulse input terminal 13, may be supplied to a clock pulse terminal C of each of the above-mentioned flip-flops through an inverter 14 and a NOR gate 15 as shift pulse. Terminals $\overline{Q}$ of the flip-flops 4 to 11 are connected to corresponding input terminals of inverters 16 and 23, respectively. By using a read control signal $S^1$ being output in such a way as described below, the content for the first bit through 8th bit in the shift register 3 may be read out in parallel from read-out terminals 24 to 31.

Figure 2A:
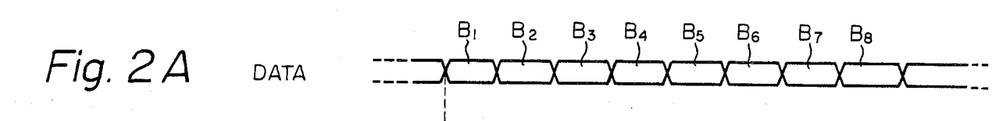
FIGS. 2A to 2G are timing charts for explaining the operation of the embodiment illustrated in FIG. 1.
Figures 2B, 2C:
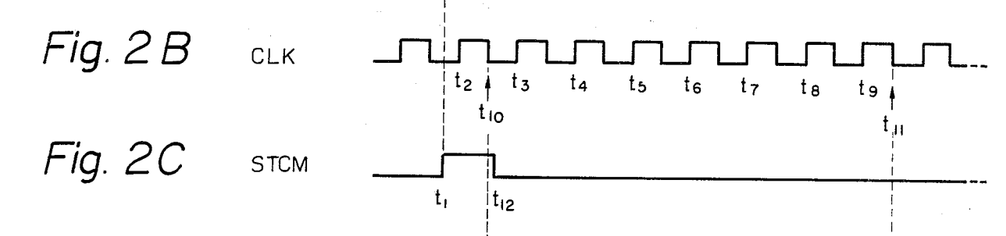
Figure 2D:
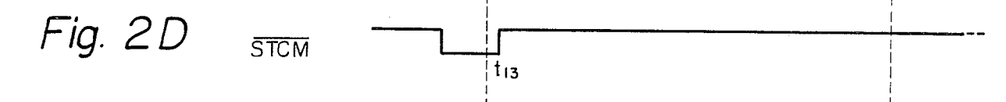
Figure 2E:
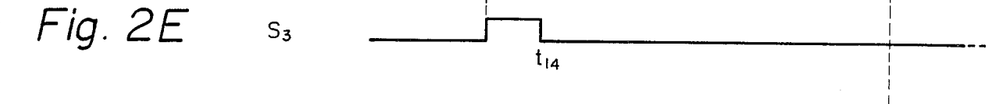

A start command signal STCM, the logical level of which becomes "1" during the time till its "0" level applied to the D input of the flip-flop 35 in FIG. 1, is successively read into the flip-flop 35 in FIG. 1. (namely the timing $t_{13}$ occurs sufficiently later than the timing $t_{11}$ to make enough hold time for the flip-flop 35 in FIG. 1) is applied to a terminal 32, so as to identify the initiation time of the desired data with 8 bits each (c.f. FIGS. 2A and 2C).

Figure 2F:
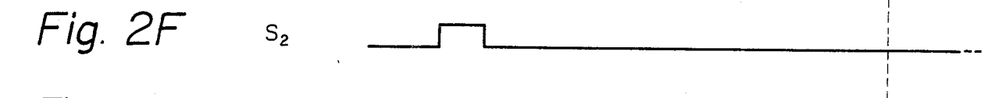

This start command signal STCM is input, via an inverter 33, into a start signal generator 34, which may generate a start signal $S^2$ by detecting the start time of the signal STCM. This start signal generator 34 comprises a NOR gate 36 and a D type flip-flop 35, in which an inverted start command signal $\overline{STCM}$ having an inverted logical level of the signal STCM is fed to a terminal D of the flip-flop 35 and an inverted read clock signal $\overline{CLK}$ is supplied to a terminal C of the same flip-flop. Accordingly, as can be seen from wave-form charts of FIGS. 2B to 2E, an output signal $S_3$ from a terminal $\overline{Q}$ of the flip-flop 35 may be varied from "0" to "1" at the first trailing end point of the clock signal CLK just after the time when the signal STCM has attained "1". The signals $S_3$ and signal STCM are fed into their individual input terminals of NOR gate 36, respectively, and thus, a start signal $S_2$, as illustrated in FIG. 2F, can be obtained.

Figure 2G:
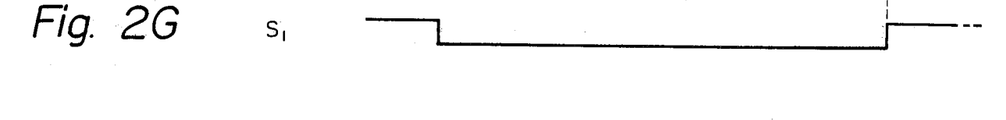

The signal $S_2$, as a setting input, is fed into an R-S flip-flop circuit 39 comprised of NOR gates 37 and 38, and at the same time, it may be applied through an inverter 40 to a set terminal S of the flip-flop 5, as well as a rest terminal R of each of the flip-flops 6 to 12. Consequently, when the level of the start signal $S_2$ becomes high, each state of the flip-flops 6 to 12 corresponding to the individual portions up to the 7th bit in the rear of the register 3 is reset so that every terminal Q of the flip-flops obtain the state "0", while the flip-flop 5 corresponding to the 8th bit portion from the rear end of the shift register 3 is set and its terminal Q may attain "1". Since the output $S_1$ of NOR gate 37 becomes "0" in accordance with the setting of the R-S flip-flop 39 due to a high level of the output signal $S_2$ as illustrated in FIG. 2G, a NOR gate 15 is opened. Therefore, the clock pulse signal CLK can be fed into each of the flip-flops 4 to 12 and the desired data signals $B_1, B_2 \ldots$ (FIG. 2A) of the data stream DATA, may be successively read into the register 3 via inverters 41 and 43. On the other hand, since a terminal $\overline{Q}$ of the flip-flop 12 of the register 3 is connected to one input terminal of a NOR gate 42, to the other input terminal of which the clock pulse CLK transmitted from NOR gate 15 is fed the output of the terminal $\overline{Q}$ of flip-flop 12 is "0" while this terminal $\overline{Q}$ is maintained at "1", and thus, the R-S flip-flop 39 is not reset and the NOR gate 15 still remains in an open state. However, when the set content of the flip-flop 5 has been consecutively shifted into the flip-flop 12, the output of its terminal $\overline{Q}$ becomes "0" and NOR gate 42 is opened. As a result, the clock signal CLK may be applied to one input terminal of the NOR gate 38 in the flip-flop 39 via the gate 42. Further, with the resetting of this flip-flop 39, the NOR gate 15 is closed and the shifting operation of the register 3 is terminated. In this way, the R-S flip-flop 39 starts to supply the read clock signal CLK into the shift register 3 when the level of the detection output signal $S_2$ becomes high, namely, when the first datum of the desired 8 bit data of the data stream is fed to the terminal D of flip-flop 4. The flip-flop 39 may act as a control circuit which controls the supply of the read clock signal CLK into the register 3, so as to halt the feeding of the clock signal, when the predetermined content of flip-flop 5 has been shifted to the flip-flop 12. Thus, after the signal STCM varies from "0" to "1" at the time $t_1$ (FIG. 2B), the detection signal $S_2$ is immediately output and the portions up to the 7th bit from the rear end of shift register 3 are reset, and at the same time, the 8th bit portion is set. Furthermore, the NOR gate 15 is opened and the required data $B_1, B_2 \ldots B_8$ of the data stream may be consecutively input at the individual rising times $t_2, t_3 \ldots t_9$ of the clock signal CLK.

An initial value for the flip-flop 5 is stably shifted in the shift register together with the data with 8 bits each owing to the data input mentioned above and, when the datum $B_8$ is read into flip-flop 4, this initial value is transferred into flip-flop 12 to change the $\overline{Q}$ output into "0". As a result, the R-S flip-flop 39 is operated to close the NOR gate 15 and shifting operations of the register 3 is stopped in such a state that the data $B_1$ through $B_8$ are stored in the flip-flop circuits 11 through 4. At the timing $t_{11}$, the signal $S_1$ becomes "1", due to the resetting of the R-S flip-flop 39, and the desired data may be read from each of the terminals 24 to 31 in parallel.

Only the datum with a desired bit number may be stably read into the shift register regardless of the signal STCM after inputing the first datum of the required data group. Therefore, it is possible to provide a highly reliable buffer register having a non-complicated configuration, in which the precise specifying of the pulse width of the signal STCM is unnecessary, and further, any error of the digit for input data may be perfectly avoided.

While the above described exemplary embodiment represents a preferred form of this invention in which any desired 8 bit data of the data stream may be read in, it will be readily understood that the present invention is not limited to use in such a number of bit, but is applicable to a buffer register for any other bit. And moreover, it can be applied to a read-out circuit.

Figure 3A:
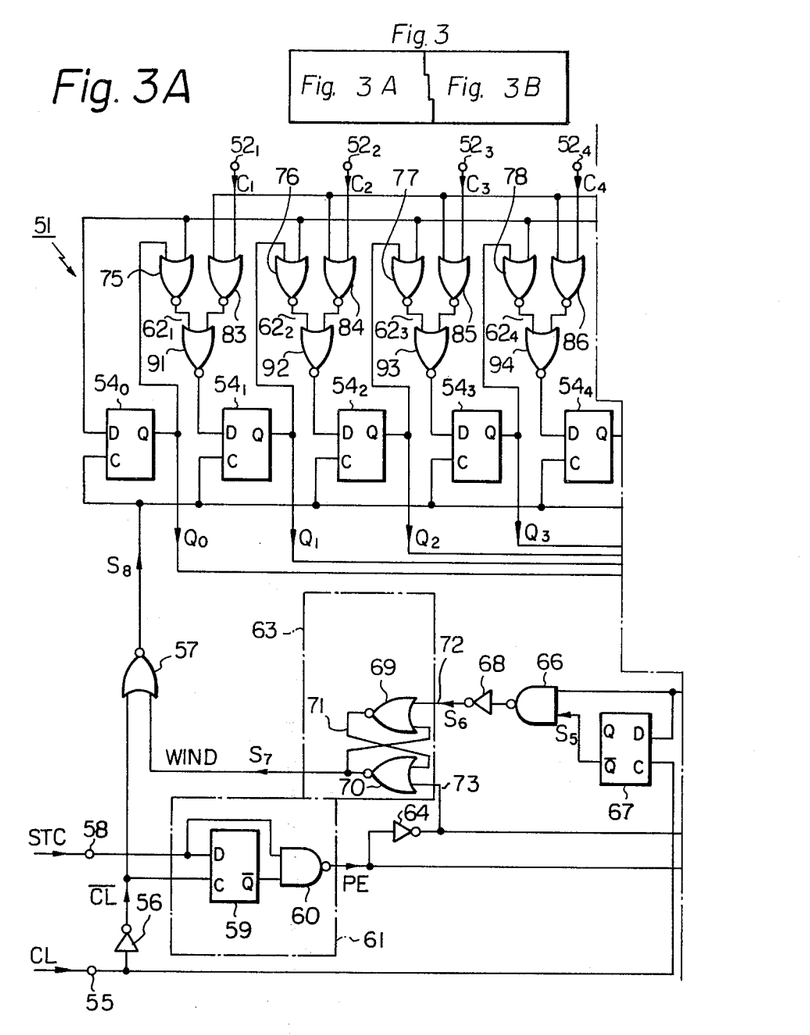
FIGS. 3A and 3B taken together in the manner as indicated in FIG. 3 comprise a circuit diagram of an another embodiment according to the present invention.
Figure 3B:
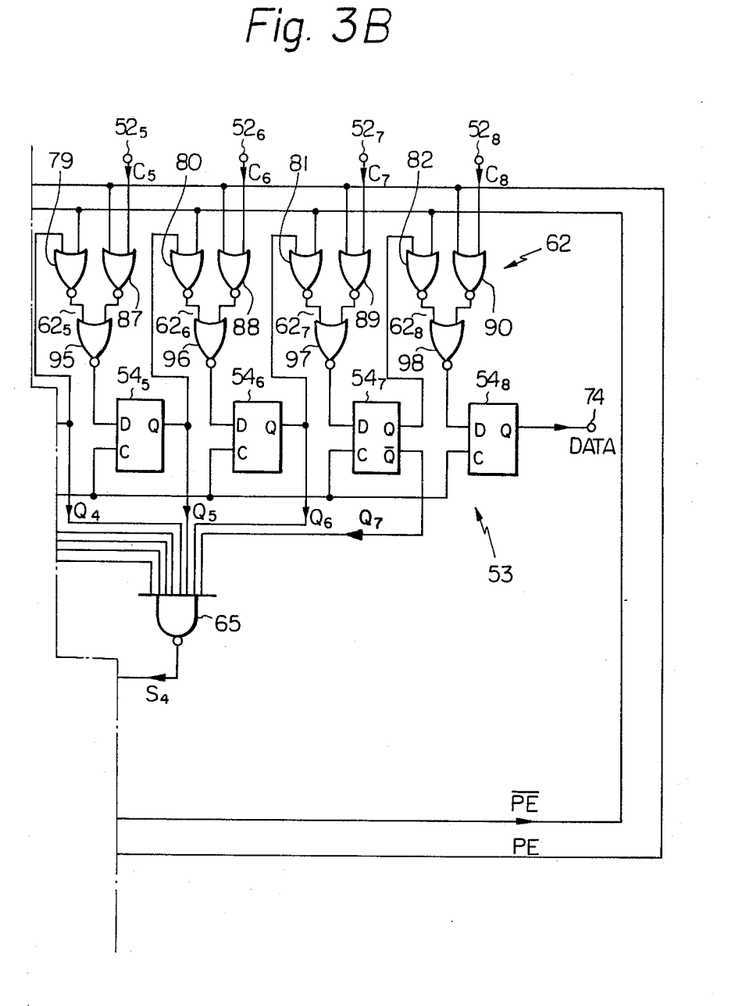

Referring now to FIG. 3, which is an illustration of a circuit diagram of a data read-out circuit 51 constructed in accordance with the shift register circuit of the present invention. The circuit 51 is another embodiment of the present invention. The data read-out circuit 51 has input terminals $52_1$ to $52_8$, to which an 8 bit parallel datum $D_1$ composed of bits $C_1$ to $C_8$ can be applied in parallel. In this embodiment, the parallel data with 8 bits each are applied to the input terminals in such a way that the most significant bit of the parallel datum is applied to the input terminal $52_8$ and each least significant bit is applied to the input terminal $52_1$.

Figure 4A:
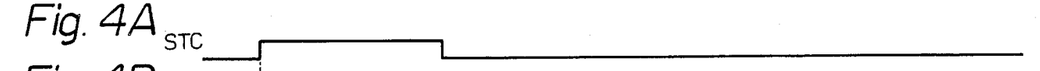
FIGS. 4A to 4K are timing charts for explaining the operation of the embodiment illustrated in FIG. 3.
Figure 4B:
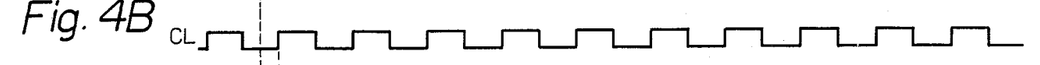
Figure 4C:
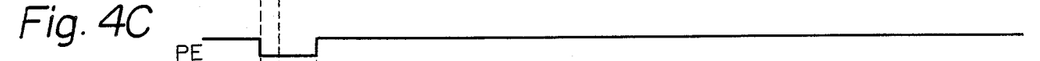

The data read-out circuit 51 has a shift register 53 to store the parallel datum and to read out the parallel datum as a serial datum with 8 bits corresponding thereto by shifting the parallel datum in sequence. The shift register 53 has the capacity of 8 bits plus 1 bit and is a known circuit of nine D type flip-flops $54_0$ to $54_8$ which are connected in series. A clock signal CL supplied to an input terminal 55 may be applied to each clock terminal C of the D type flip-flops $54_0$ to $54_8$ through an inverter 56 and a NOR gate 57. An inverted clock signal $\overline{CL}$ obtained from the inverter 56 is applied to a clock terminal C of a D type flip-flop 59, in which a start command signal STC is applied to an input terminal D through a terminal 58. The D type flip-flop 59 is operated as a timing signal generator 61 together with a NAND gate 60, to which a Q output from the flip-flop 59 and the start command signal STC are applied, respectively. The timing signal generator 61 has the same function as that of the start signal generator illustrated in FIG. 1. Therefore, when the level of the start command signal STC is changed from "0" to "1" at the time $t_1$, as shown in FIG. 4A, and the level of the signal STC returns to "0" again after a lapse of time longer than at least one period of the clock signal CL, the timing signal generator 61 is able to produce a start timing signal PE. The level of the timing signal PE is changed from "1" into "0" at the time of $t_1$ and returns to "1" at the time of $t_2$, which is the first trailing edge of the signal CL after the time $t_1$ (FIGS. 4B and 4C).

The start timing signal PE is applied to a write control circuit 62 composed of NAND gates 75 through 98, and to an R-S flip-flop 63 mainly composed of NOR gates 69 and 70. The write control circuit 62 is composed of eight sets of gate circuits $62_1$ to $62_8$, which are arranged so as to correspond to D type flip-flops $54_1$ to $54_8$, respectively. Each of the gate circuits $62_1$ to $62_8$ has three NOR gates. In the write control circuit $62_1$ the start timing signal PE is supplied to one input terminal of each of the NOR gates 83 to 90, and the data $C_1$ to $C_8$ of the parallel datum which are applied to each of the input terminals $52_1$ to $52_8$, can be applied to each input terminal D of the D type flip-flops $54_1$ through $54_8$ when the level of the signal PE is "1". As a result, bit data of the parallel datum applied to the input terminals $52_1$ through $52_8$ can be written in the D type flip-flops $54_1$ to $54_8$ in parallel. On the other hand, an inverted start timing signal $\overline{PE}$ from an inverter 64 is supplied to one input terminal of each of the NOR gates 75 to 82, and the signal on the Q output terminal of D type flip-flops is applied to the input terminal D of the sequence D type flip-flops. The inverted start timing signal $\overline{PE}$ is also applied to the D input terminal of the D type flip-flop $54_0$. Therefore, when the level of the signal PE is "1", the write control circuit 62 is operated so as to write the bit data of the input parallel datum into the D type flip-flops $54_1$ to $54_8$ at the predetermined time and, at the same time, the content of the D type flip-flop $54_0$ becomes "1".

The output signals $Q_0$ to $Q_6$ from each output terminal Q of the flip-flops $54_0$ to $54_6$ and the output signal $\overline{Q}_7$ from the output terminal $\overline{Q}$ of the flip-flop $54_7$ are applied to the input terminals of a NAND gate 65, respectively, and the output signal $S_4$ from the NAND gate 65 is applied to one input terminal of the NAND gate 66. The signal $S_2$ is also applied to the D input terminal of a D type flip-flop 67 to the clock terminal C of which the clock signal CL is applied. As a result an inverted delay signal $S_5$, which is delayed by one time period of the clock signal CL compared to the output signal $S_4$, is obtained. The signal $S_5$ is applied to the other input of the NAND gate 66. The output of the NAND gate 66 is inverted by an inverter 68 and the output signal $S_6$ of the inverter 68 is applied to a reset input line 72 of the R-S flip-flop 63. On the other hand, the signal $\overline{PE}$ is supplied to a set input line 73 of the R-S flip-flop 63. Consequently, the level of the output signal $S_7$ from the R-S flip-flop 63 changes from "1" to "0" at the time of the building-up of the signal $\overline{PE}$, and changes from "0" to "1" at the time of the building-up of the signal $S_6$. The output signal $S_7$ is applied to one input terminal of a NOR gate 57, to the other input terminal of which the inverted clock signal $\overline{CL}$ is applied. As a result, the clock signal CL can be obtained from the NOR gate 57 only when the level of the output signal $S_7$ is "0". The output signal $S_8$ from the NOR gate 57 is supplied to each clock terminal C of the D type flip-flops $54_0$ to $54_8$ as a shift pulse signal.

The operation of the data read-out circuit 51 will now be explained with reference to FIGS. 3 and 4A through 4K.

Figure 4D:
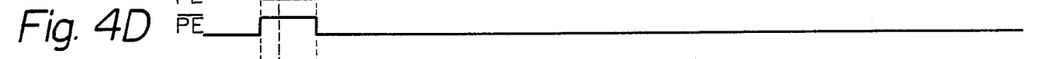
Figures 4E, 4F:
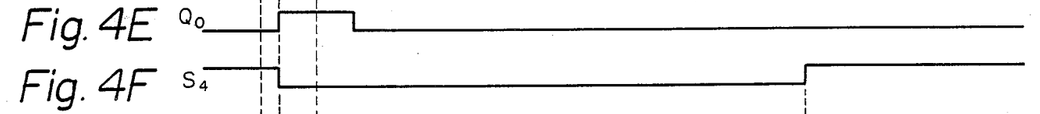
Figure 4G:
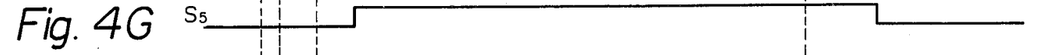
Figures 4H, 4I:
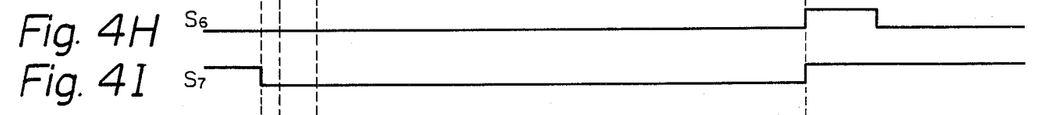
Figure 4J:
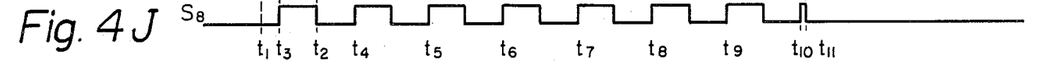

When the level of the start command signal STC becomes "1" at the time of $t_1$ (FIG. 4A), as seen from FIGS. 4C and 4D, the level of the start timing signal PE becomes "0", and at the same time, the level of the inverted start timing signal $\overline{PE}$ becomes "1". The above-mentioned level condition of the signals PE and $\overline{PE}$ is maintained until the time $t_2$. Therefore, since the level of one input terminal of each of the NOR gates 83 to 90 is "0" and the level of one input terminal of each of the NOR gates 75 to 82 is "1" between the time $t_1$ and the time $t_2$, each of the data $C_1$ to $C_8$ supplied to the input terminals $52_1$ to $52_8$ is applied to a corresponding input terminal D of the D type flip-flops $54_1$ to $54_8$. In addition, the input terminal D of the D type flip-flop $54_0$ receives the signal $\overline{PE}$.

Since the R-S flip-flop 48 is set when the level of the signal PE changes from "1" to "0" at the time of $t_1$, at this time, the level of the output signal $S_7$ changes from "1" to "0" (FIG. 3I), so that the NOR gate 34 is opened. As a result, as illustrated in FIG. 3J, the signal $S_8$ is supplied to the shift register 53 as a shift clock signal after the time $t_1$. As the D type flip-flops $54_0$ to $54_8$ are leading edged trigger type flip-flops, these flip-flops carry out the above-mentioned write operation at the time of $t_3$. Thus, at the time $t_3$, parallel datum with 8 bits is written into the flip-flops $54_1$ to $54_8$ in parallel and the flip-flop $54_0$ is set.

Figure 4K:
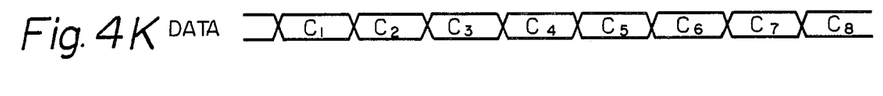

Since the level of the signal PE becomes "1" and the level of the signal $\overline{PE}$ becomes "0" after the time $t_2$, the NOR gates 75 to 82 are opened and the NOR gates 83 to 90 are closed. Consequently, the D input terminals of the flip-flops $54_1$ to $54_8$ are respectively connected to the output terminals Q of the flip-flops $54_0$ to $54_7$, through the gate circuits $62_1$ to $62_8$, in such a manner that these flip-flops $54_0$ to $54_8$ can be operated as a shift register. As a result, after this, the parallel datum is shifted in the shift register 53 every time the level of the signal $S_8$ changes from "0" to "1", that is at the times $t_4$, $t_5$, $t_6$ ... and $t_{10}$, and the parallel datum is read out from the shift register as serial data corresponding thereto. In this case, as the signal $\overline{PE}$ supplied to the input terminal D of the D type flip-flop $54_0$ changes from "1" to "0" at the time $t_2$, it follows that the flip-flop $54_0$ is reset every time the level of the signal $S_8$ changes from "0" to "1" after the time $t_2$. Consequently, when the flip-flop $54_0$ is set at the time $t_3$ has been shifted to the flip-flop $54_6$, all of the Q output levels of the flip-flops $54_0$ to $54_6$ becomes "0" and the level of the $\overline{Q}$ output of the flip-flop $54_7$ becomes "0". Therefore, since the level of the output signal $S_4$ from the NAND gate 65 becomes "1" at the time of $t_{11}$, just after the time $t_{10}$ (FIG. 3F), the reset signal $S_6$ becomes "1" at the time $t_{11}$, as illustrated in FIG. 3H, so that the R-S flip-flop 63 is reset at the time $t_{11}$. As a result, the level of the signal $S_7$ becomes "1" at the time $t_{11}$. For the above-mentioned operation, supplying the signal $S_8$ to the shift register 6 is stopped and, after this, the read-out operation from the output terminal 74 is stopped. FIG. 4K illustrates data obtained from the output termnal 51.

In the above case, when the level of the start command signal STC becomes high again, as the R-S flip-flop 63 is set, the above-mentioned parallel to serial converting operation can be carried out for another parallel datum of 8 bits.

As will be understood from the above description, in this data read-out circuit 51, the bit capacity of the shift register 53 is selected so as to be larger than the number of bits of the desired parallel datum by at least one, each bit of the parallel datum are set in the flip-flops $54_1$ to $54_8$ of the shift register and the flip-flop $54_0$, which is the (N+1)th flip-flop in the case of counting from the flip-flop $54_8$, is set at "0". Thus, in the shift operation of the shift register 53, when it is detected that the logical level "1" set into the flip-flop $54_0$ is shifted to the flip-flop $54_7$, the supplying the shift clock signal to the shift register is stopped. Therefore, since the end of the reading-out is automatically detected in the circuit 51 only by the application of the start time for reading-out, it is not required to generate a window pulse with a pulse width which is precisely determined in accordance with number of bits of the parallel datum when the parallel to serial converting operation is carried out. Moreover, as the end time for the reading-out is exactly and automatically detected in the circuit 52 it is possible to exactly read out only the necessary information.

In addition, since the control for the application of the shift pulse is carried out on the basis of the clock signal CL, the circuit 51 perfectly achieves the desired operation, even if the period of the clock signal CL changes during the operation.

In the above described embodiment, although parallel datum with 8 bits is read out as serial data corresponding thereto, the present invention is not limited to use in such a read-out of the parallel datum with 8 bits, but it is applicable to a data read-out circuit for parallel datum with any number of bits.

What is claimed is:

1. A shift register circuit for receiving a start command signal and for converting the format of N bit data, where, comprising:
    a shift register having a capacity of at least N+1 bits and having a rear end at the first bit position, for performing shift operations on a serial data stream of continuous N bit data which is applied to the N+1th bit position of said shift register;
    first means, operatively connected to said shift register, for setting said shift register to a predetermined condition by generating a start signal, in dependence upon the start command signal, representing a start time for a converting operation of the shift register circuit, said predetermined condition being that the content of a Kth (K≦N) bit position from said rear end of said shift register is a logical state and the individual contents from the rear end bit position to the K−1th bit position of said shift register are a second logical state;
    second means, operatively connected to said shift register, for detecting whether or not said shift register has carried out said shift operations depending upon the contents of said shift register, and for providing an output signal;
    a gate circuit, operatively connected to said shift register, for controlling the application of a shift pulse to said shift register, said gate circuit being operated so as to be opened in dependence upon said start signal and closed in dependence upon said output signal from said second means.

2. A shift register circuit as recited in claim 1, wherein, said second means detects that the content of the Kth bit position set by said setting means has been shifted to the rear end bit position of said shift register.

3. A shift register circuit, having means for receiving a start command signal and means for receiving a read clock signal, for converting the format of serial data to N bit parallel data, where N represents a positive integer, comprising:
    start signal generator means, operatively connected to the means for receiving the start command signal and operatively connected to the means for receiving the read clock signal, for providing, as an output, a start signal in dependence upon the read clock signal and the start command signal;
    an R-S flip-flop, operatively connected to said start signal generator means, for receiving said start signal and for providing, as outputs, a first logic signal and a read control signal;
    a gate circuit, operatively connected to the means for receiving the read clock signal and operatively connected to said R-S flip-flop, for providing a shift pulse signal in dependence upon the read clock signal and said first logic signal; and
    a shift register having a capacity of N+1 bits and having a rear end at the first bit position, said shift register operatively connected to receive the serial data at the N+1th bit position and operatively connected to said gate circuit, said start signal generator means, and said R-S flip-flop, said shift register for providing, as an output, N bit parallel data in dependence upon said read control signal, said shift pulse signal and said start signal, said start signal setting said shift register to a predetermined condition, said predetermined condition being that the content of a Kth (K≦N) bit position from said rear end of said shift register is a first logical state and the individual contents from said rear end of said shift register to the K−1th bit position of said shift register are a second logical state.

4. A shift register circuit as set forth in claim 3, wherein said shift register comprises N+1 D-type flip-flops connected in series and wherein the clock terminal of each of said D-type flip-flops is operatively connected to said gate circuit to receive said shift pulse signal.

5. A shift register circuit, having means for receiving a start command signal and means for receiving a clock signal, for converting received N bit parallel data to serial data, where N represents a positive integer, comprising:
    a timing signal generator, operatively connected to the means for receiving the start command signal and to the means for receiving the clock signal, for providing a start signal in dependence upon the start command signal and the clock signal;
    an R-S flip-flop, operatively connected to said timing generator, for receiving said start timing signal and for providing, as an output, a first logic signal;
    a gate circuit, operatively connected to the means for receiving the clock signal and to said R-S flip-flop, for providing, as an output, a shift pulse signal in dependence upon the clock signal and said first logic signal;
    a write control circuit, operatively connected to receive the N bit parallel data and operatively connected to said timing signal generator, for providing N write control signals in dependence upon said start timing signal;

a shift register having a capacity of at least N+1 bits and operatively connected to said gate circuit and said R-S flip-flop, said write control circuit operatively connected to the first through Nth bit positions, said shift register for providing the serial data, as an output, from the first bit position in dependence upon said shift pulse signal and said N write control signals and for providing a reset signal to said R-S flip-flop when the second through N+1th bit positions have been reset to a predetermined condition.

6. A shift register circuit as set forth in claim 5, wherein said shift register comprises N+1 D-type flip-flops and wherein the clock terminal of said D-type flip-flops is operatively connected to said gate circuit to receive said shift pulse signal.

7. A shift register circuit as set forth in claim 4 or 6, wherein said gate circuit comprises a NOR gate.

* * * * *

UNITED STATES PATENT AND TRADEMARK OFFICE
CERTIFICATE OF CORRECTION

PATENT NO. : 4,429,300

DATED : JANUARY 31, 1984

INVENTOR(S) : MASAO YAMASAWA ET AL.

It is certified that error appears in the above-identified patent and that said Letters Patent is hereby corrected as shown below:

[30] FOREIGN APPLICATION PRIORITY DATA
        after line 1, insert the following
        --Apr. 24, 1979 [JP] Japan ....... 55-49631--;

[57] ABSTRACT
        line 1, "A" should be --The--; and
            "a datum" should be --N-bit datum--;
        line 2, delete "with N bits";
        line 5, "setting means" should be --start signal--;
        line 8, "means" should be --circuit--.

Col. 1, after line 5, insert the following headings:

--BACKGROUND OF THE INVENTION

1) Field of the Invention--;

UNITED STATES PATENT AND TRADEMARK OFFICE
CERTIFICATE OF CORRECTION

PATENT NO. : 4,429,300

DATED : JANUARY 31, 1984

INVENTOR(S) : MASAO YAMASAWA ET AL.

It is certified that error appears in the above-identified patent and that said Letters Patent is hereby corrected as shown below:

```
Col. 1, after line 9, insert the following heading:

--2) Description of the Prior Art--;

line 10, "In various types of digital devices shift"
                 should be --Shift--;
        line 11, after "used" insert --in various types of
                 digital devices--;
        line 13, after "as" insert --corresponding--;
        line 14, delete "corresponding thereto";
        line 19, "and control" should be --. The serial to
                 parallel converter also controls--;
        line 21, "storing" should be --stores--;
        line 24, delete "there";
        line 25, delete "is a tendency to cause such an"; and
                 delete "that";
        line 26, "other" should be --tends to occur and--;
        line 28, "in" should be --into--;
        line 29, delete "the" (both occurrences); and before
                 "im-" insert --an--;
```

UNITED STATES PATENT AND TRADEMARK OFFICE
CERTIFICATE OF CORRECTION

PATENT NO. : 4,429,300

DATED : JANUARY 31, 1984

INVENTOR(S) : MASAO YAMASAWA ET AL.

It is certified that error appears in the above-identified patent and that said Letters Patent is hereby corrected as shown below:

line 30, "of" should be --in--; after "the" insert --timing--; and "of timing for its" should be --of the--;

line 31, "and such a" should be --. This--;

line 32, delete "the";

line 34, delete ", for the pur-";

lines 35-36, delete lines in their entirety;

line 37, delete "data,";

line 38, after "used" insert --for the purpose of reading out the pulse code modulated parallel data with a plurality of bits each in the form of serial data--; and "an" should be --a--;

line 39, "which determines" should be --for determining--;

line 40, after "series" insert --,--; and ", so that" should be --. Thus,--;

line 42, delete "both of the"; and "above mentioned" should be --above-mentioned--;

line 45, after "the" insert --input--; and delete "for inputing";

UNITED STATES PATENT AND TRADEMARK OFFICE
CERTIFICATE OF CORRECTION

PATENT NO. : 4,429,300
DATED : JANUARY 31, 1984
INVENTOR(S) : MASAO YAMASAWA ET AL.

It is certified that error appears in the above-identified patent and that said Letters Patent is hereby corrected as shown below:

line 46, delete "(reading)";
        line 47, "and the" should be --. The--; and "said" should be --the--;
        line 52, after "be" insert --large and--;
        line 53, delete "and large in size";

after line 53, insert the following heading:

--SUMMARY OF THE INVENTION--;

line 57, delete "an";
        line 59, after "to" insert --corresponding--; and delete "corresponding";
        line 60, "thereto only by" should be --by only--;
        line 63, after "and" insert --which--;
        line 65, delete "a";
        line 67, after "to" insert --corresponding--.

Col. 2, line 1, "corresponding thereto only by" should be --by only--;
        line 3, "A" should be --The--;
        line 4, "more than" should be --at least N+1--;

UNITED STATES PATENT AND TRADEMARK OFFICE
CERTIFICATE OF CORRECTION

PATENT NO. : 4,429,300

DATED : JANUARY 31, 1984

INVENTOR(S) : MASAO YAMASAWA ET AL.

It is certified that error appears in the above-identified patent and that said Letters Patent is hereby corrected as shown below:

```
line 5, delete "N"; and delete "by at least one";
line 8, change ", and each" to --.  Each--; and after
        "set" insert --, by a setting means,--;
line 9, delete "by a setting";
line 10, delete "means";
line 17, delete "the" (first occurrence);
line 26, delete "so as";

after line 39, insert the following heading:

--BRIEF DESCRIPTION OF THE DRAWINGS--;

line 43, "an" should be --a first--;
line 48, delete "an";
line 49, "another" should be --a second--;

after line 52, insert the following heading:

--DESCRIPTION OF THE PREFERRED EMBODIMENTS--;

line 57, delete "," (first occurrence);
```

UNITED STATES PATENT AND TRADEMARK OFFICE
CERTIFICATE OF CORRECTION

PATENT NO. : 4,429,300

DATED : JANUARY 31, 1984

INVENTOR(S) : MASAO YAMASAWA ET AL.

It is certified that error appears in the above-identified patent and that said Letters Patent is hereby corrected as shown below:

```
           line 65,  after "as" insert --a--;
           line 68,  "S¹" should be --S₁--.

Col. 3,    line 1,   "for" should be --of--;
           line 5,   "till" should be --until--;
           line 6,   before "applied" insert --is--;
           line 7,   "namely" should be --i.e.,--;
           line 9,   "make" should be --provide--;
           line 10,  "1)" should be --1) and--;
           line 15,  "S²" should be --S₂--;
           line 17,  ", in which" should be --.  An--;
           line 18,  delete "an" (first occurrence); and change
                     "an" (second occurrence) to --a--;
           line 19,  delete "inverted--; and after "level" insert
                     --which is the inverse--;
           line 27,  "signal STCM" should be --STCM--;
           line 28,  "their" should be --the--;
           line 33,  delete "it";
           line 35,  "rest" should be --reset--;
           line 38,  "portions" should be --bit positions--;
           line 40,  ", while" should be --.  At the same time,--;
```

UNITED STATES PATENT AND TRADEMARK OFFICE
CERTIFICATE OF CORRECTION

PATENT NO. : 4,429,300
DATED : JANUARY 31, 1984
INVENTOR(S) : MASAO YAMASAWA ET AL.

It is certified that error appears in the above-identified patent and that said Letters Patent is hereby corrected as shown below:

line 41, "portion" should be --position--;
          line 46, delete "a";
          line 54, "fed" should be --fed,--;
          line 57, delete "still".

Col. 4, line 10, "portions" should be --positions--;
          line 12, "portion" should be --position--;
          line 20, "into" should be --in--;
          line 30, "inputing" should be --inputting--;
          line 35, delete "any error of the digit for"; and "may be perfectly" should be --digit errors are always--;
          line 41, "in such a number of bit" should be --with 8 bit data--;
          line 42, "other bit" should be --number of bits"; and "And more-" should be --Furthermore--;
          line 43, delete "over";
          line 58, delete "a".

Col. 5, line 3, "Q" should be --$\overline{Q}$--;
          line 18, "NAND" should be --NOR--;
          line 52, "$S_2$" should be --$S_4$--.

UNITED STATES PATENT AND TRADEMARK OFFICE
CERTIFICATE OF CORRECTION

PATENT NO. : 4,429,300              Page 8 of 9
DATED      : JANUARY 31, 1984
INVENTOR(S): MASAO YAMASAWA ET AL.

It is certified that error appears in the above-identified patent and that said Letters Patent is hereby corrected as shown below:

Col. 6, line 11, delete "the" and delete "of";
        line 13, "." should be --,--;
        line 25, "48" should be --63--;
        line 26, delete "the" and delete "of";
        line 28, "34" should be --57--;
        line 29, "3J" should be --4J--;
        line 32, "edged trigger" should be --edge triggered--;
        line 33, delete "the" (second occurrence);
        line 34, delete "of" and delete "the";
        line 49, after "as" insert --corresponding--; and delete "corresponding thereto";
        line 52, delete "the" (first occurrence);
        line 54, delete "the" (first occurrence);
        line 55, delete "the" (first occurrence); and after "$t_3$" insert --and--;
        line 60, delete "the" (first and third occurrences); delete "of"; and "3F" should be --4F--;
        line 61, delete "the";
        line 62, "3H" should be --4H--; and delete "the" (second occurrence);
        line 65, "6" should be --53--;
        line 68, "51" should be --74--.

UNITED STATES PATENT AND TRADEMARK OFFICE
CERTIFICATE OF CORRECTION

PATENT NO. : 4,429,300

DATED : JANUARY 31, 1984

INVENTOR(S) : MASAO YAMASAWA ET AL.

It is certified that error appears in the above-identified patent and that said Letters Patent is hereby corrected as shown below:

Col. 7, line 10, "are" should be --is--;
      line 25, "52" should be --51--.

Signed and Sealed this

*Nineteenth* Day of *March 1985*

[SEAL]

*Attest:*

DONALD J. QUIGG

*Attesting Officer*     *Acting Commissioner of Patents and Trademarks*